United States Patent
Moon et al.

(10) Patent No.: US 9,985,693 B2
(45) Date of Patent: May 29, 2018

(54) INTEGRATED CIRCUIT INCLUDING MULTIPLE TRANSMITTERS AND NEAR FIELD COMMUNICATION SYSTEM INCLUDING THE CIRCUIT

(71) Applicant: SAMSUNG ELECTRONICS CO., LTD., Suwon-si (KR)

(72) Inventors: Byeong Taek Moon, Seoul (KR); Ii Jong Song, Suwon-si (KR); Sang Hyo Lee, Incheon (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days. days.

(21) Appl. No.: 15/422,589

(22) Filed: Feb. 2, 2017

(65) Prior Publication Data

US 2017/0288732 A1 Oct. 5, 2017

(30) Foreign Application Priority Data

Mar. 31, 2016 (KR) .......................... 10-2016-0038874

(51) Int. Cl.
*H04B 5/00* (2006.01)
*H03H 7/40* (2006.01)

(52) U.S. Cl.
CPC ............. *H04B 5/0031* (2013.01); *H03H 7/40* (2013.01); *H04B 5/0056* (2013.01)

(58) Field of Classification Search
USPC .......................... 455/41.1–41.3, 550.1, 552.1
See application file for complete search history.

(56) References Cited

U.S. PATENT DOCUMENTS

| | | | |
|---|---|---|---|
| 9,118,354 B2* | 8/2015 | Kole | H04B 5/0031 |
| 9,160,423 B2* | 10/2015 | Brauchler | H01L 29/7393 |
| 2007/0246546 A1 | 10/2007 | Yoshida | |
| 2008/0194298 A1 | 8/2008 | Panabaker et al. | |
| 2009/0184805 A1 | 7/2009 | Yamada | |
| 2010/0087146 A1 | 4/2010 | Han et al. | |
| 2011/0127951 A1 | 6/2011 | Walley et al. | |
| 2012/0077593 A1 | 3/2012 | Sarmenta | |
| 2013/0052947 A1* | 2/2013 | Kole | H04B 5/0031 |
| | | | 455/41.1 |
| 2014/0045425 A1 | 2/2014 | Roh et al. | |
| 2014/0187153 A1 | 7/2014 | Zhu et al. | |

(Continued)

*Primary Examiner* — Fayyaz Alam
(74) *Attorney, Agent, or Firm* — Sughrue Mion, PLLC

(57) ABSTRACT

An integrated circuit for near field communication (NFC) is provided. The integrated circuit includes a semiconductor substrate; a first transmitter disposed on the semiconductor substrate and configured to operate in a first NFC card mode, an NFC reader mode, and a peer-to-peer mode; a second transmitter disposed on the semiconductor substrate and configured to operate in a second NFC card mode; first transmitting pins connected to the semiconductor substrate and configured to transmit an output signal of the first transmitter to a first NFC antenna; second transmitting pins connected to the semiconductor substrate and configured to transmit an output signal of the second transmitter to a second NFC antenna; and a logic circuit disposed on the semiconductor substrate and configured to receive a control signal, and control an operation of the first transmitter and an operation of the second transmitter based on the control signal.

18 Claims, 15 Drawing Sheets

(56) References Cited

U.S. PATENT DOCUMENTS

| | | |
|---|---|---|
| 2014/0220889 A1 | 8/2014 | Zhu et al. |
| 2014/0280982 A1 | 9/2014 | Patel et al. |
| 2015/0333805 A1* | 11/2015 | Brauchler ........... H01L 29/7393 |
| | | 455/41.1 |
| 2016/0073222 A1* | 3/2016 | Lee ..................... H04M 1/7253 |
| | | 455/41.1 |

* cited by examiner

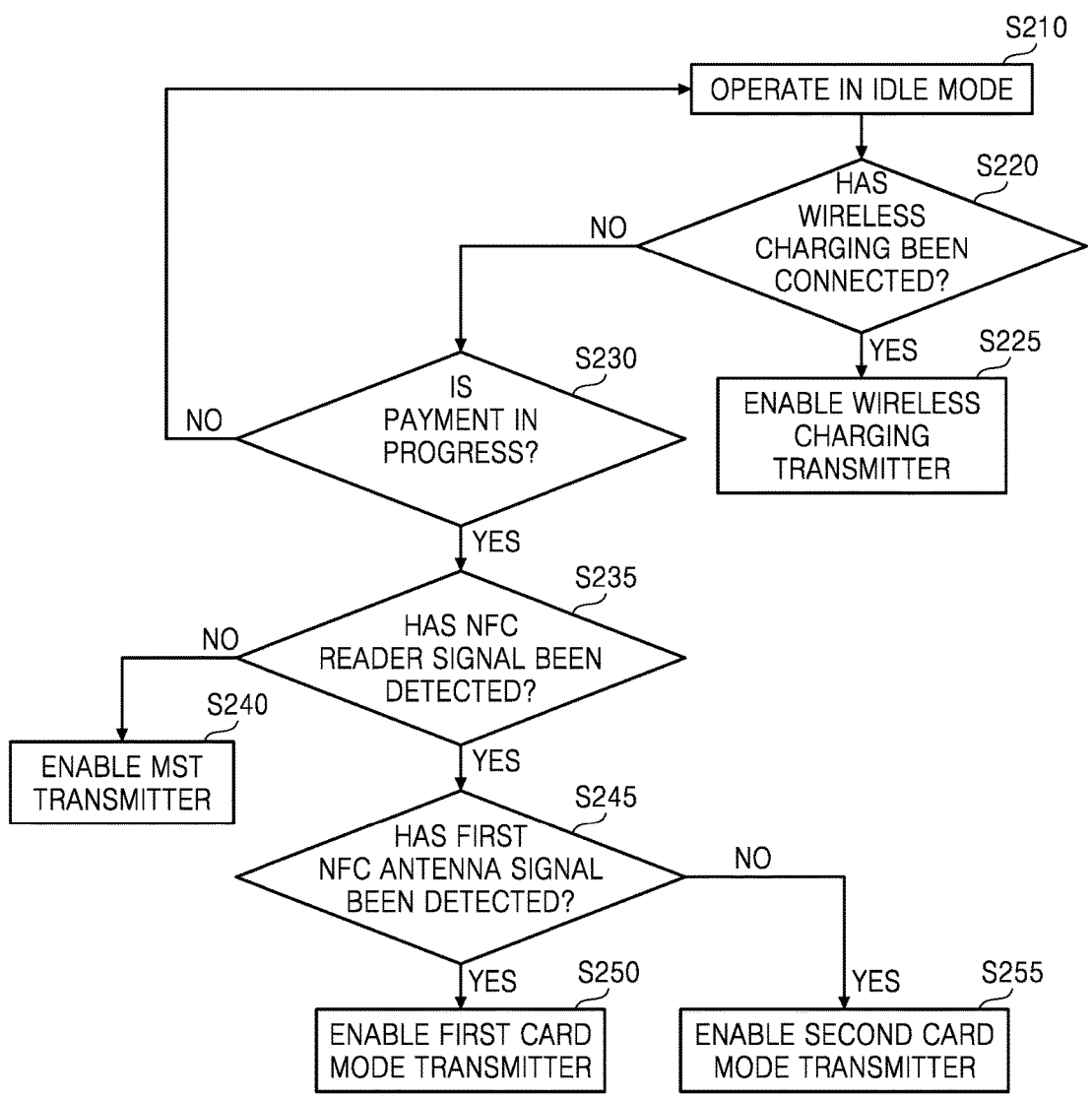

US 9,985,693 B2

INTEGRATED CIRCUIT INCLUDING MULTIPLE TRANSMITTERS AND NEAR FIELD COMMUNICATION SYSTEM INCLUDING THE CIRCUIT

CROSS-REFERENCE TO RELATED APPLICATION

This application claims priority under 35 U.S.C. § 119(a) from Korean Patent Application No. 10-2016-0038874 filed on Mar. 31, 2016, the disclosure of which is hereby incorporated by reference in its entirety.

BACKGROUND

Methods and apparatuses consistent with exemplary embodiments relate to an integrated circuit, and more particularly, to an integrated circuit including multiple transmitters placed at a single-chip semiconductor substrate, and a near field communication (NFC) system including the integrated circuit.

NFC is a short-range communication method using a carrier frequency of 13.56 MHz. A loop antenna is used in NFC. A magnetic secure transmission (MST) is another communication method separate from an NFC system. Both the MST method and the NFC method are used on smart phones. The MST method uses a transmitter similar in structure to an NFC transmitter, and also uses a loop antenna for signal transmission.

SUMMARY

According to an aspect of an exemplary embodiment, there is provided an integrated circuit for near field communication (NFC), the integrated circuit including: a semiconductor substrate; a first transmitter disposed on the semiconductor substrate and configured to operate in a first NFC card mode, an NFC reader mode, and a peer-to-peer mode; a second transmitter disposed on the semiconductor substrate and configured to operate in a second NFC card mode; first transmitting pins connected to the semiconductor substrate and configured to transmit an output signal of the first transmitter to a first NFC antenna; second transmitting pins connected to the semiconductor substrate and configured to transmit an output signal of the second transmitter to a second NFC antenna; and a logic circuit disposed on the semiconductor substrate and configured to receive a control signal, and control an operation of the first transmitter and an operation of the second transmitter based on the control signal.

According to an aspect of another exemplary embodiment, there is provided a near field communication (NFC) system including: an integrated circuit; a processor configured to control an operation of the integrated circuit; a first NFC antenna; and a second NFC antenna. The integrated circuit includes: a semiconductor substrate; a first transmitter disposed on the semiconductor substrate and configured to operate in a first NFC card mode, an NFC reader mode, and a peer-to-peer mode; a second transmitter disposed on the semiconductor substrate and configured to operate in a second NFC card mode; first transmitting pins connected to the semiconductor substrate and configured to transmit an output signal of the first transmitter to the first NFC antenna; second transmitting pins connected to the semiconductor substrate and configured to transmit an output signal of the second transmitter to the second NFC antenna; and a logic circuit disposed on the semiconductor substrate and configured to control an operation of the first transmitter and an operation of the second transmitter according to control of the processor.

According to an aspect of still another exemplary embodiment, there is provided a mobile device including: a first transmitter configured to operate in a first near field communication (NFC) mode and an NFC reader mode; a second transmitter configured to operate in a second NFC mode; and a processor configured to generate a control signal to control the first transmitter and the second transmitter based on secure information stored in a secure element of the mobile device.

BRIEF DESCRIPTION OF THE DRAWINGS

The above and other features and advantages will become more apparent by describing in detail exemplary embodiments thereof with reference to the attached drawings in which:

FIG. 15 is a flowchart of a method of operating an NFC system according to one or more exemplary embodiments.

DETAILED DESCRIPTION OF EXEMPLARY EMBODIMENTS

Figure 1:
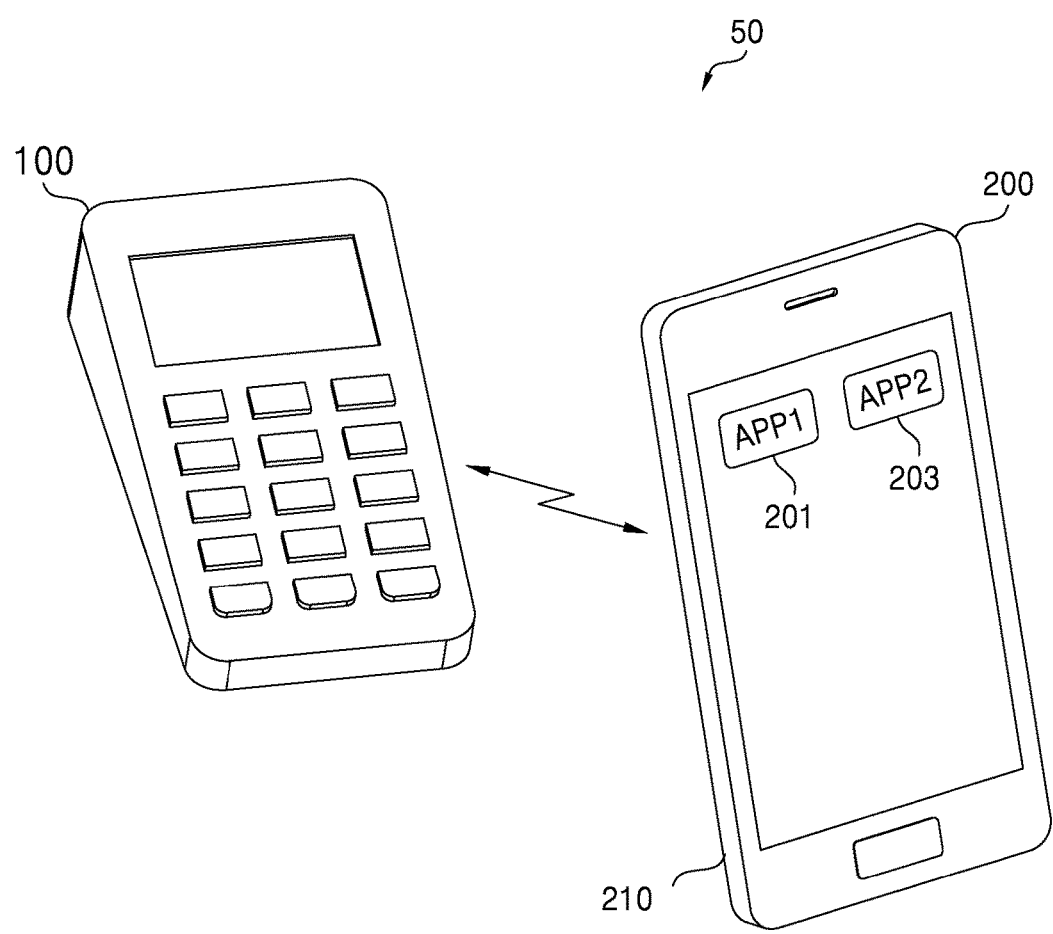
FIG. 1 is a schematic block diagram of a system including a payment terminal and a mobile device according to one or more exemplary embodiments.

FIG. 1 is a schematic block diagram of a system 50 including a payment terminal 100 and a mobile device 200 according to one or more exemplary embodiments. The radio communication system 50 may include the payment terminal 100 and the mobile device 200. Although the mobile device 200 illustrated in FIG. 1 is a smart phone, the mobile device 200 may be a tablet personal computer (PC), a personal digital assistant (PDA), an enterprise digital assistant (EDA), a mobile internet device (MID), a wearable computer, an internet of things (IoT) device, or an internet of everything (IoE) device.

The mobile device 200 may include multiple transmitters which support or use various radio communication protocols and antennas connected to the multiple transmitters. The multiple transmitters may be integrated into a single-chip integrated circuit and may include a transmitter for near field communication (NFC), a common transmitter for both magnetic secure transmission (MST) and NFC, and a transmitter for wireless charging or inductive charging, but the kinds of transmitters integrated into the single-chip integrated circuit are not restricted to these examples.

Although the payment terminal 100 is illustrated in FIG. 1 as an example of a device which communicates with the mobile device 200, the payment terminal 100 may be any device which includes an NFC transceiver (or an NFC receiver), an MST receiver, and/or a wireless charger receiver for wireless charging to communicate with the mobile device 200. The mobile device 200 may include an application processor 205, which executes a first payment application 201 for carrying out payment using MST and/or a second payment application 203 for carrying out payment using NFC; and a secure element (207 in FIG. 2), which securely stores security data (e.g., security data of a user of the mobile device 200) necessary for the payment using MST or NFC.

Figure 2:
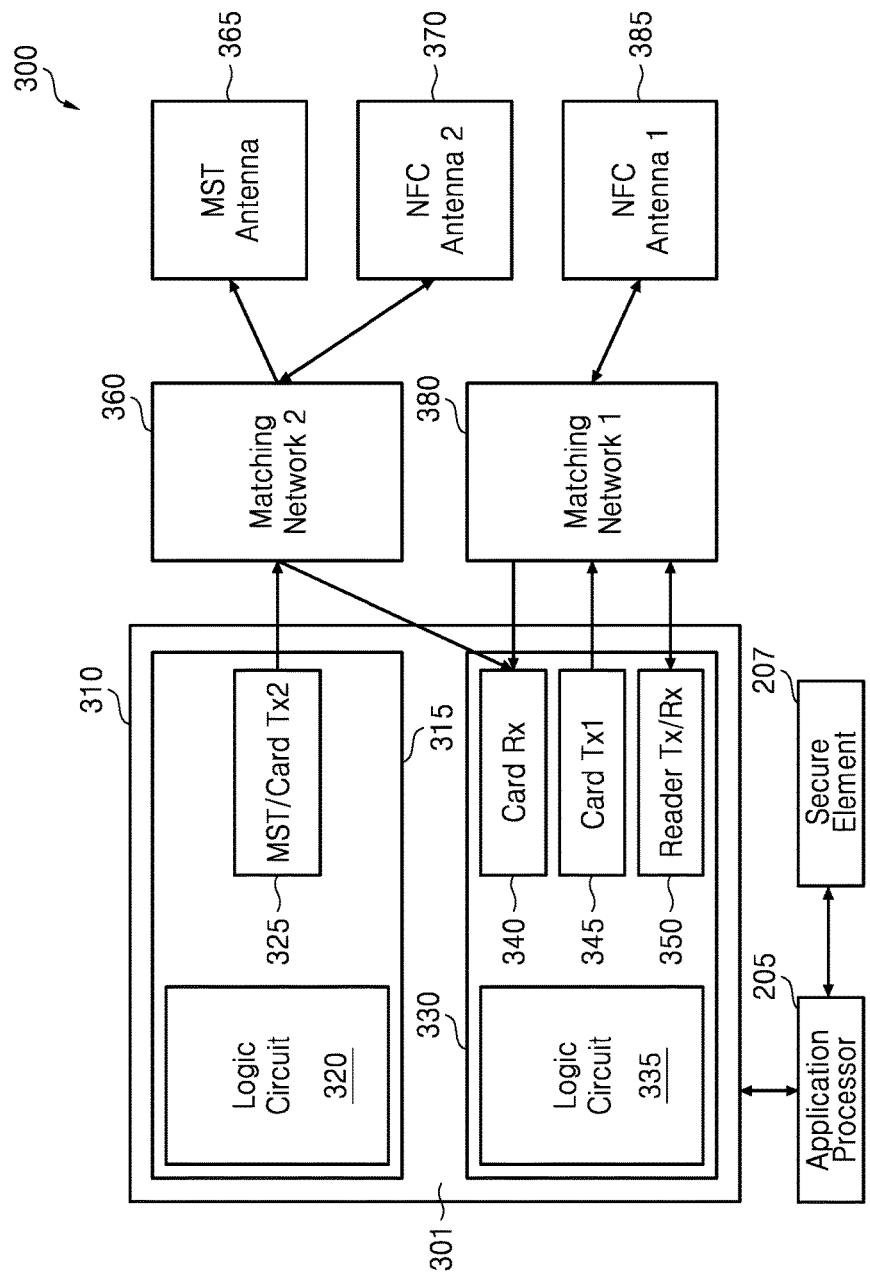
FIG. 2 is a schematic block diagram of a near field communication (NFC) system according to one or more exemplary embodiments.

FIG. 2 is a schematic block diagram of an NFC system 300 embedded in the mobile device 200 illustrated in FIG. 1 according to one or more exemplary embodiments. Referring to FIGS. 1 and 2, the NFC system 300 embedded in the mobile device 200 may include a communication chip (or a single-chip integrated circuit) 310, a second matching network 360, an MST antenna 365, a second NFC antenna 370, a first matching network 380, and a first NFC antenna 385. Although the application processor 205 and the secure element 207 are illustrated together with the NFC system 300, exemplary embodiments are not limited thereto. The NFC system 300 may be the mobile device 200.

The application processor 205 may control the operation of the communication chip 310 and the secure element 207. The communication chip 310 implemented as a single-chip integrated circuit may include a first circuit 315 and a second circuit 330. Although the first and second circuits 315 and 330 are separated from each other conceptually according to their functions, exemplary embodiments are not limited thereto. The first and second circuits 315 and 330 may be combined as a single circuit.

The first and second circuits 315 and 330 may be integrated or disposed on a single-chip semiconductor substrate (a common substrate) 301. Being "on" the single-chip semiconductor substrate 301 may indicate being on or above the single-chip semiconductor substrate 301, or being in the single-chip semiconductor substrate 301.

The first circuit 315 may include a first logic circuit 320 and a common transmitter 325. The first logic circuit 320 may control the operation of the common transmitter 325. The first logic circuit 320 may transmit a first signal (or a first data signal) for MST communication or a second signal (or a second data signal) for NFC to the common transmitter 325.

The common transmitter 325 may be used to perform MST communication and communication for NFC card mode (referred to as a card emulation mode). In other words, the common transmitter 325 may be used for the MST communication or for only the NFC card mode. Accordingly, the common transmitter 325 may transmit the first data signal for the MST communication or the second data signal only for the NFC card mode to the second matching network 360.

The second matching network 360 may transmit the first data signal to a first external device through the MST antenna 365 and may transmit the second data signal to a second external device through the second NFC antenna 370. The first external device and the second external device may be the same or different devices.

NFC is a contactless near field communication technique using a frequency bandwidth of 13.56 MHz. It may use the second NFC antenna 370 implemented as a loop antenna to transmit signals and/or power. MST uses a frequency bandwidth up to 20 KHz and may use the MST antenna 365 implemented as loop antenna for the MST communication.

Figure 10:
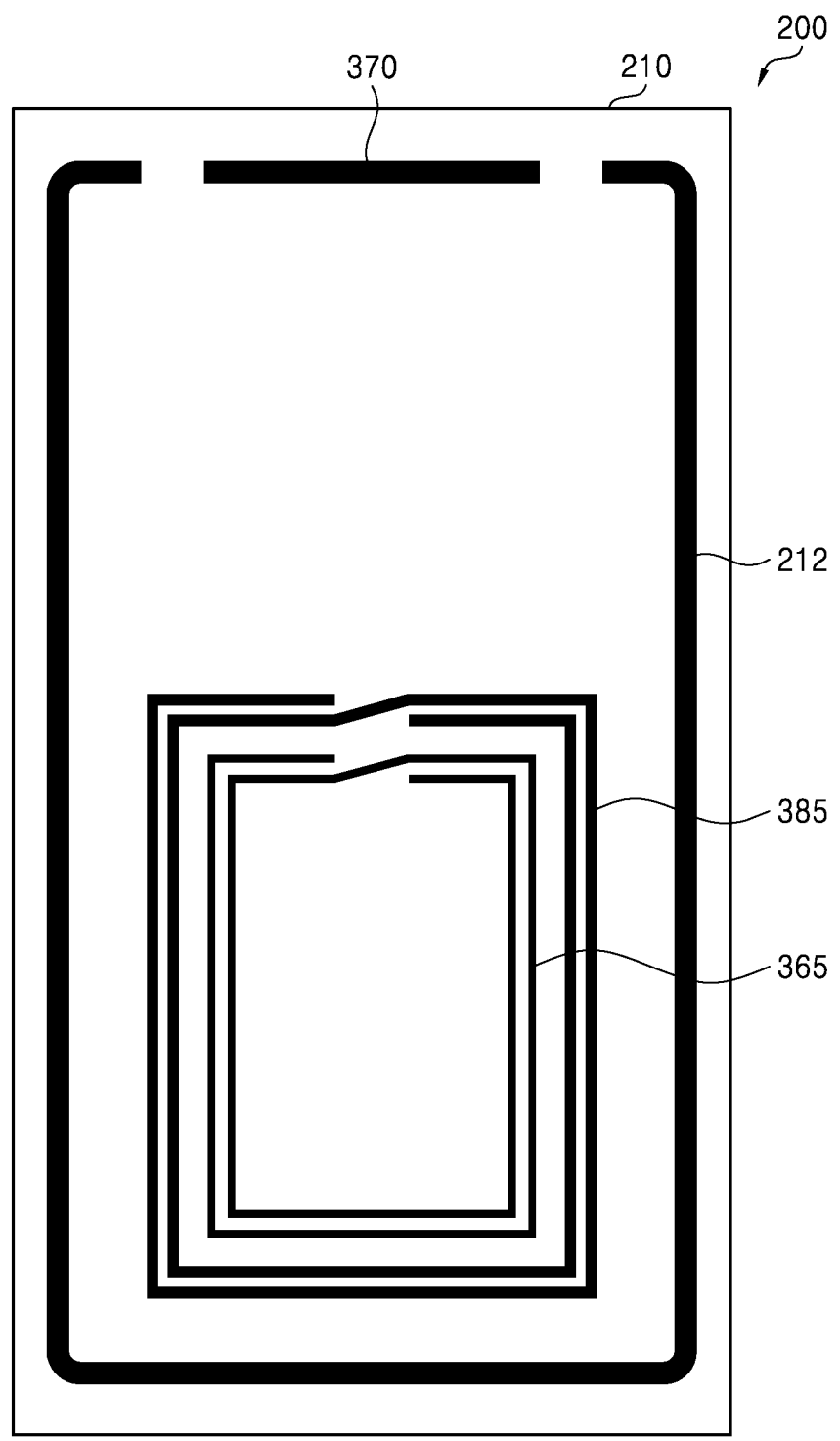
FIG. 10 is a diagram of the layout of antennas according to one or more exemplary embodiments.

The common transmitter 325 used in common for the MST communication and the communication for the NFC card mode may share the second matching network 360. The second NFC antenna 370, which is disposed at the upper portion of a back side 210 of the mobile device 200, as shown in FIG. 10, may be independently used for only the NFC card mode. The disposition of the second NFC antenna 370 increases the operational characteristics of NFC and a user's convenience without affecting other radio communication (e.g., cellular communication, Bluetooth, Wi-Fi, or GPS).

The NFC card mode uses very little current compared to an NFC reader mode. Accordingly, the common transmitter 325 used in the NFC card mode transmits a data signal to an NFC reader in a very short time in response to an NFC signal transmitted from the NFC reader. Even though common transmitter 325 is used for other radio communication, the second NFC antenna 370 is used only in the NFC card mode and thus rarely affects other radio communication.

However, when the second NFC antenna 370 is used not in the NFC card mode but in an NFC reader mode, the NFC reader mode uses very large current. There is a harmonic in such large current and this harmonic may act as noise interfering with other radio communication when the second NFC antenna 370 is used for this other radio communication. To overcome this problem, the second NFC antenna 370 may be independently used only in the NFC card mode, unlike the first NFC antenna 385.

The second circuit 330 may include a second logic circuit 335, a card receiver 340 for a card mode, a card transmitter 345 for the card mode, and a reader transceiver 350 for a reader mode. Although the card transmitter 345 and the reader transceiver 350 are functionally separated from each other in the exemplary embodiments illustrated in FIG. 2, they may be implemented as a single transmitter used in common for NFC card mode, NFC reader mode, and peer-to-peer mode.

The second logic circuit 335 may control the card receiver 340, the card transmitter 345, and the reader transceiver 350. The card receiver 340 may receive and process a data signal output from the second matching network 360 or the first matching network 380 and may transmit a processed data signal to the second logic circuit 335. The second logic circuit 335 may transmit a third data signal to the card transmitter 345. The second logic circuit 335 may transmit a fourth data signal to the reader transceiver 350 and may process a data signal transmitted from the reader transceiver 350.

The first matching network 380 may transmit a data signal from the first NFC antenna 385 to the card receiver 340 or the reader transceiver 350, may transmit the third data signal from the card transmitter 345 to the first NFC antenna 385, and may transmit the fourth data signal from the reader transceiver 350 to the first NFC antenna 385. The card receiver 340, the card transmitter 345, and the reader transceiver 350 may share the first matching network 380. In addition, the common transmitter 325 and the card receiver 340 may share the second matching network 360. Although the first logic circuit 320 and the second logic circuit 335 are functionally separated from each other in the exemplary embodiments illustrated in FIG. 2, they may be integrated into a single physical logic circuit in other exemplary embodiments.

The single-chip integrated circuit 310 may include the single-chip semiconductor substrate 301, the common transmitter (or second transmitter) 325, a first transmitter, first transmitting pins, second transmitting pins, and a logic circuit. The transmitting pins may refer to transmitting pads. The second transmitter 325 is disposed on the single-chip semiconductor substrate 301 and is used for only the NFC card mode (or second NFC card mode) or used for MST. The second transmitter 325 refers to the common transmitter 325.

The first transmitter is disposed on the single-chip semiconductor substrate 301 and is used in common for the NFC card mode (or first NFC card mode), the NFC reader mode, and the peer-to-peer mode. The first transmitter may include a transmitter of the reader transceiver 350 and the card transmitter 345. The first transmitter may support only one protocol (e.g., NFC), but the second transmitter 325 may support a plurality of protocols (e.g., NFC and MST).

The first transmitting pins may be connected to the single-chip semiconductor substrate 301 to transmit an output signal of the first transmitter to the first NFC antenna 385. The second transmitting pins may be connected to the single-chip semiconductor substrate 301 to transmit an output signal of the second transmitter 325 to the second NFC antenna 370.

A single logic circuit including the logic circuits 320 and 335 may be disposed on the single-chip semiconductor substrate 301 and may control the operations of the first transmitter (e.g., a transmitter supporting all of the first NFC card mode, the NFC reader mode, and the peer-to-peer mode) and the second transmitter 325 in response to at least one control signal received from a module (e.g., the application processor 205) outside the single-chip integrated circuit 310.

Figure 3:
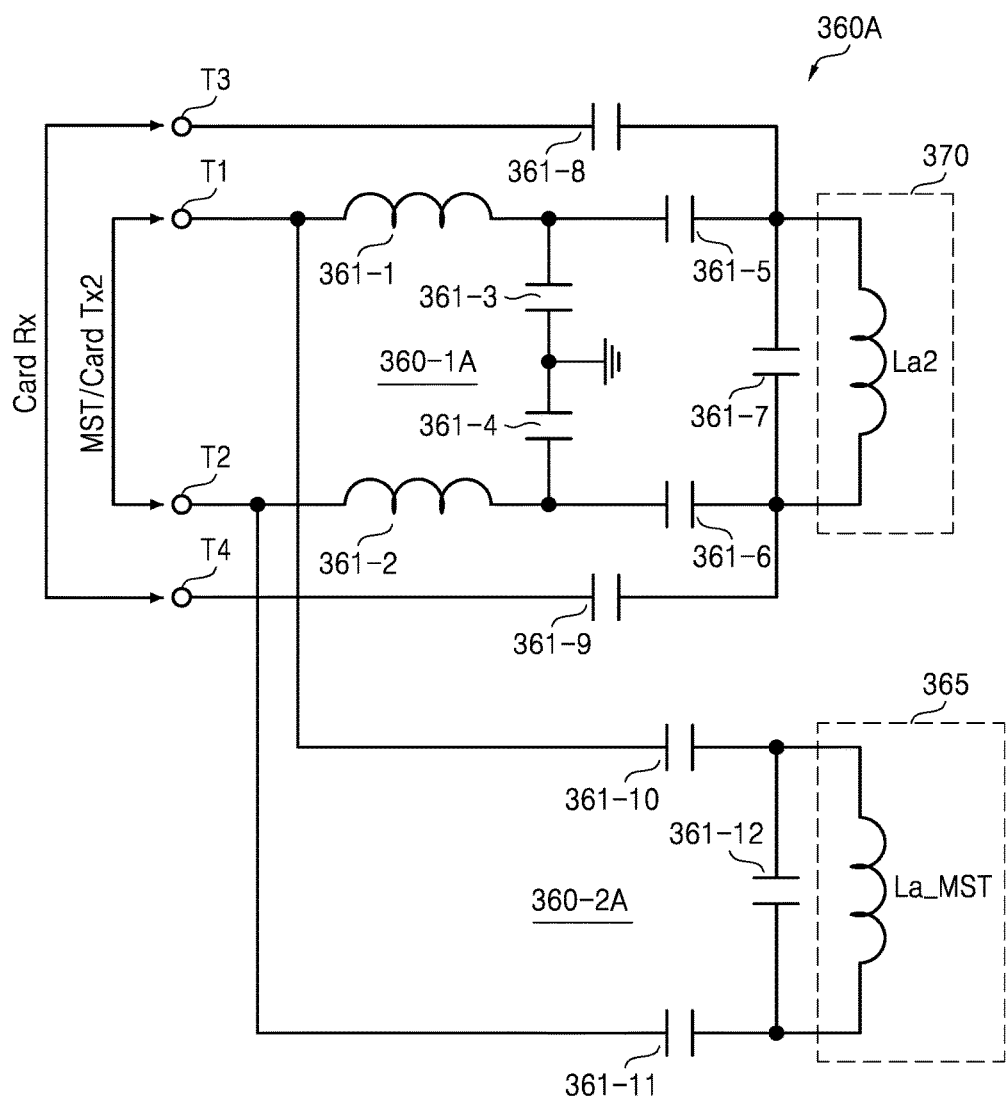
FIGS. 3-8 are circuit diagrams of a second matching network according to various exemplary embodiments.

FIGS. 3-8 are circuit diagrams of a second matching network 360 according to various exemplary embodiments. Referring to FIGS. 2 and 3, the second matching network 360A may include a first matching circuit 360-1A for only the second NFC card mode and a second matching circuit 360-2A for MST. The first and second matching circuits 360-1A and 360-2A are used for resonance and impedance matching.

The first matching circuit 360-1A uses a frequency bandwidth of 13.56 MHz and the second matching circuit 360-2A uses a frequency bandwidth up to 20 KHz. The first and second matching circuits 360-1A and 360-2A use different frequency bandwidths and are thus able to be used together in the second matching network 360A.

The first matching circuit 360-1A may include a filter (e.g., a low-pass filter), impedance matching capacitors 361-5 and 361-6, and a resonant capacitor 361-7. The low pass filter for passing the frequency bandwidth of 13.56 MHz includes inductors 361-1 and 361-2, and capacitors 361-3 and 361-4. The second NFC antenna 370 is connected in parallel with the resonant capacitor 361-7. A reference character La2 denotes an inductance of the second NFC antenna 370. The first matching circuit 360-1A may also include capacitors 361-8 and 361-9 for the card receiver 340. Terminals T1 and T2 may be connected to output terminals of the common transmitter 325, and terminals T3 and T4 may be connected to input terminals of the card receiver 340. The terminals T1 and T2 may refer to second transmitting pins.

The second matching circuit 360-2A may include serial capacitors 361-10 and 361-11, and a parallel capacitor 361-12. The serial capacitors 361-10 and 361-11 are connected in series with the MST antennal 365 and the parallel capacitor 361-12 is connected in parallel with the MST antenna 365. A reference character La_MST denotes an inductance of the MST antenna 365.

Figure 4:
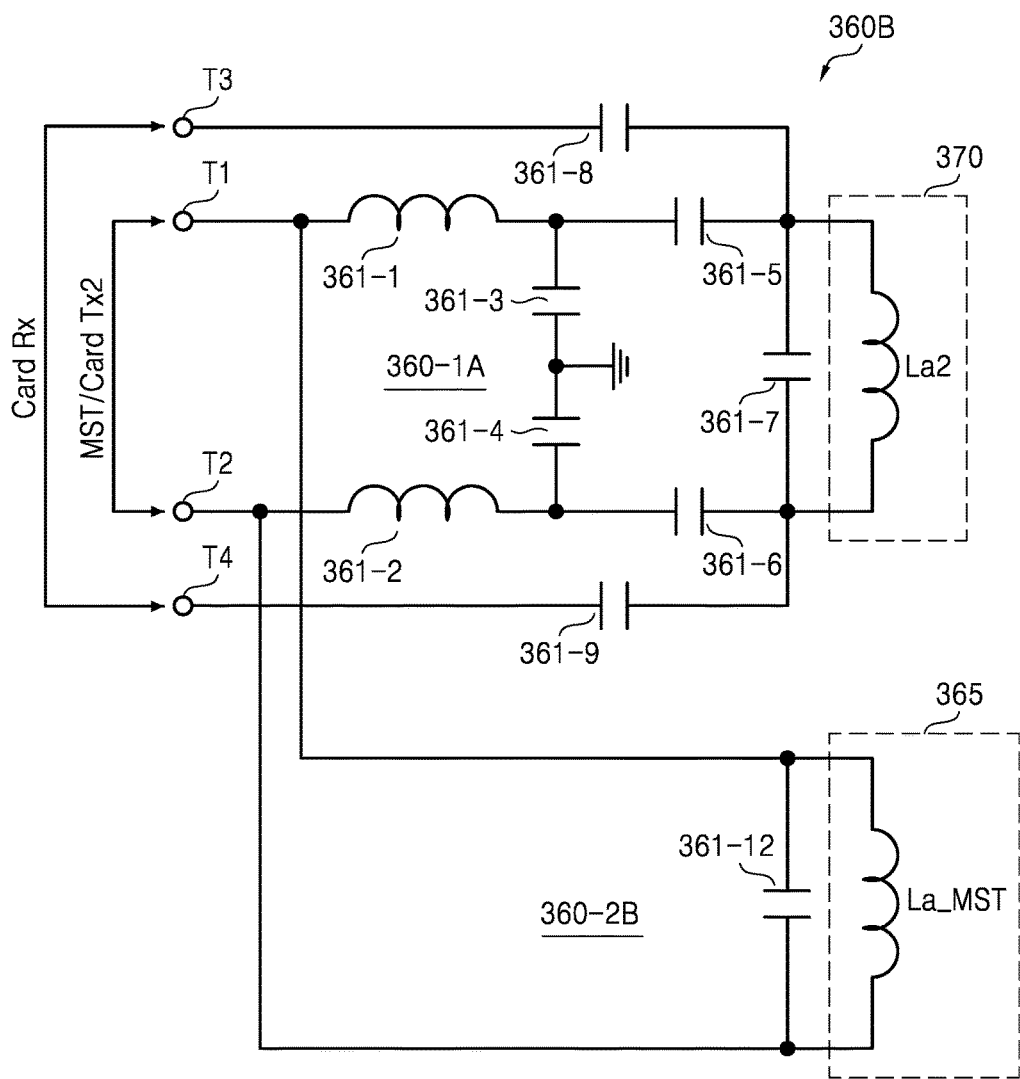

FIG. 4 is a circuit diagram of a second matching network 360 according to another exemplary embodiment. The structure of the second matching network 360B illustrated in FIG. 4 is the same as that of the second matching network 360A illustrated in FIG. 3, except for the structure of a second matching circuit 360-2B. The second matching circuit 360-2B illustrated in FIG. 4 includes only the parallel capacitor 361-12 connected in parallel with the MST antenna 365.

Figure 5:
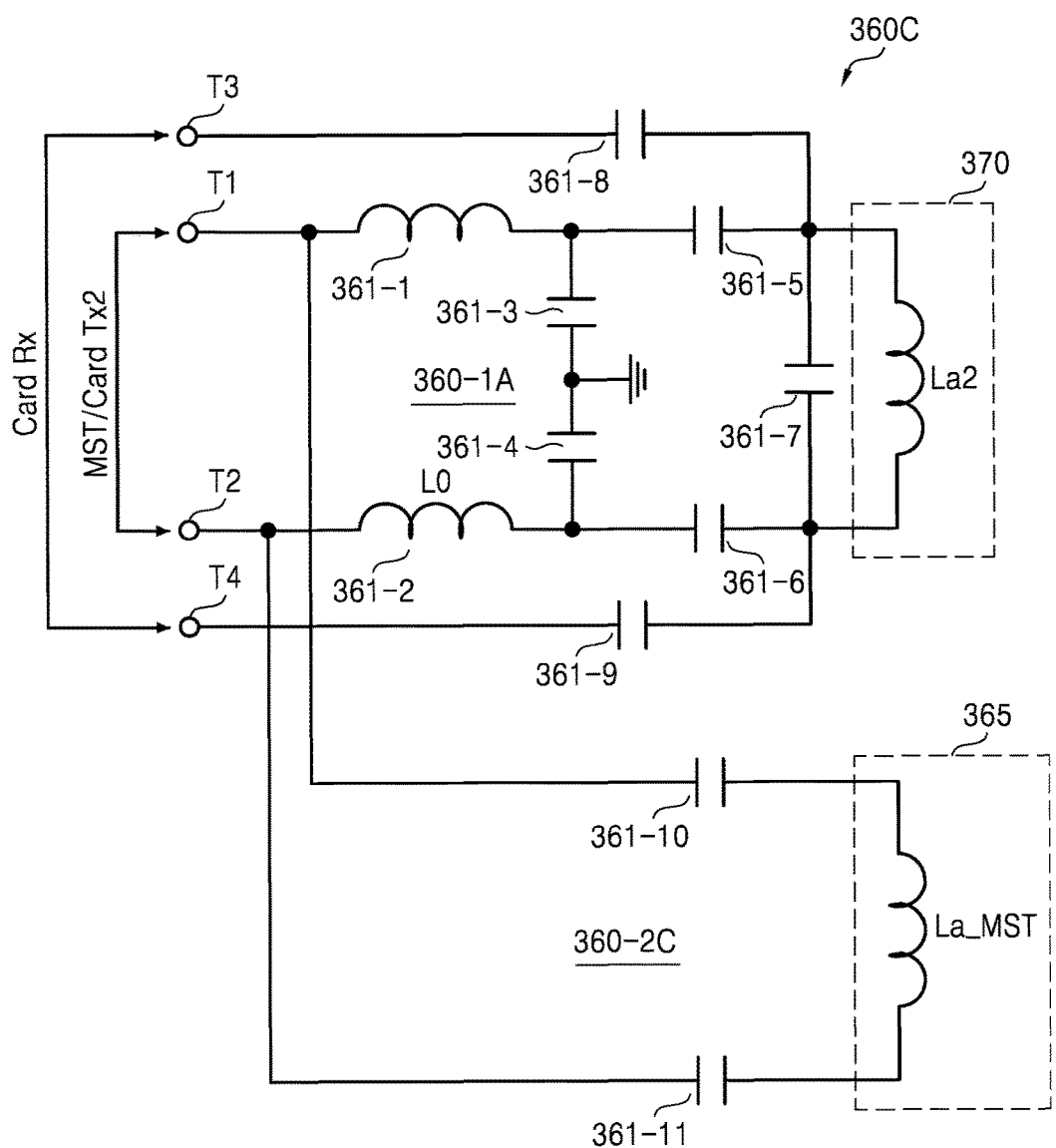

FIG. 5 is a circuit diagram of a second matching network 360 according to still another exemplary embodiment. The structure of the second matching network 360C illustrated in FIG. 5 is the same as that of the second matching network 360A illustrated in FIG. 3, except for the structure of a second matching circuit 360-2C. The second matching circuit 360-2C illustrated in FIG. 5 includes only the serial capacitors 361-10 and 361-11 connected in series with the MST antenna 365.

Figure 6:
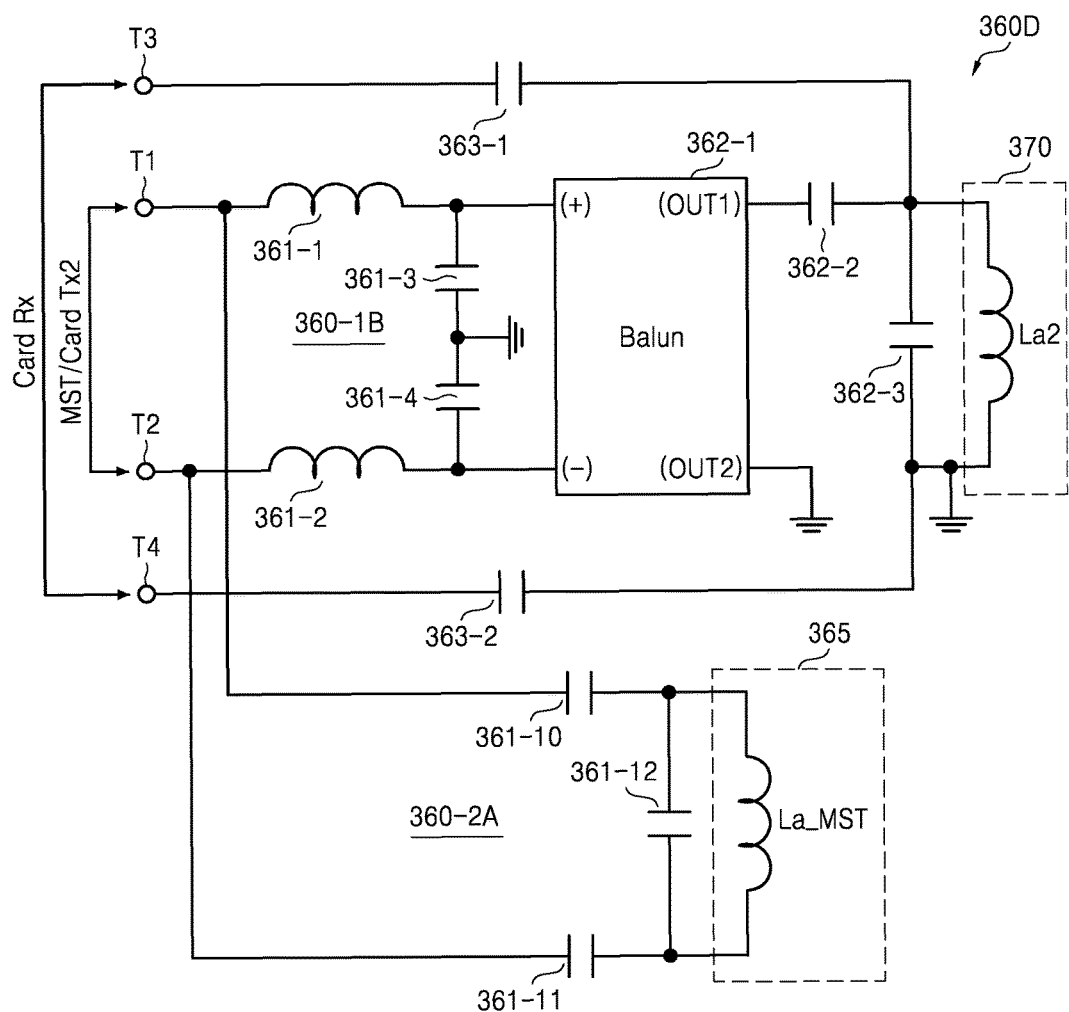

FIG. 6 is a circuit diagram of a second matching network 360 according to even another exemplary embodiment. The second matching networks 360D through 360F illustrated in FIGS. 6 through 8 use the second NFC antenna 370 illustrated in FIG. 10, and may thus have a single-ended structure. A first terminal of the second NFC antenna 370 illustrated in FIGS. 6 through 8 is connected to a capacitor 362-2; and a second terminal of the second NFC antenna 370 is connected to the ground.

Figure 7:
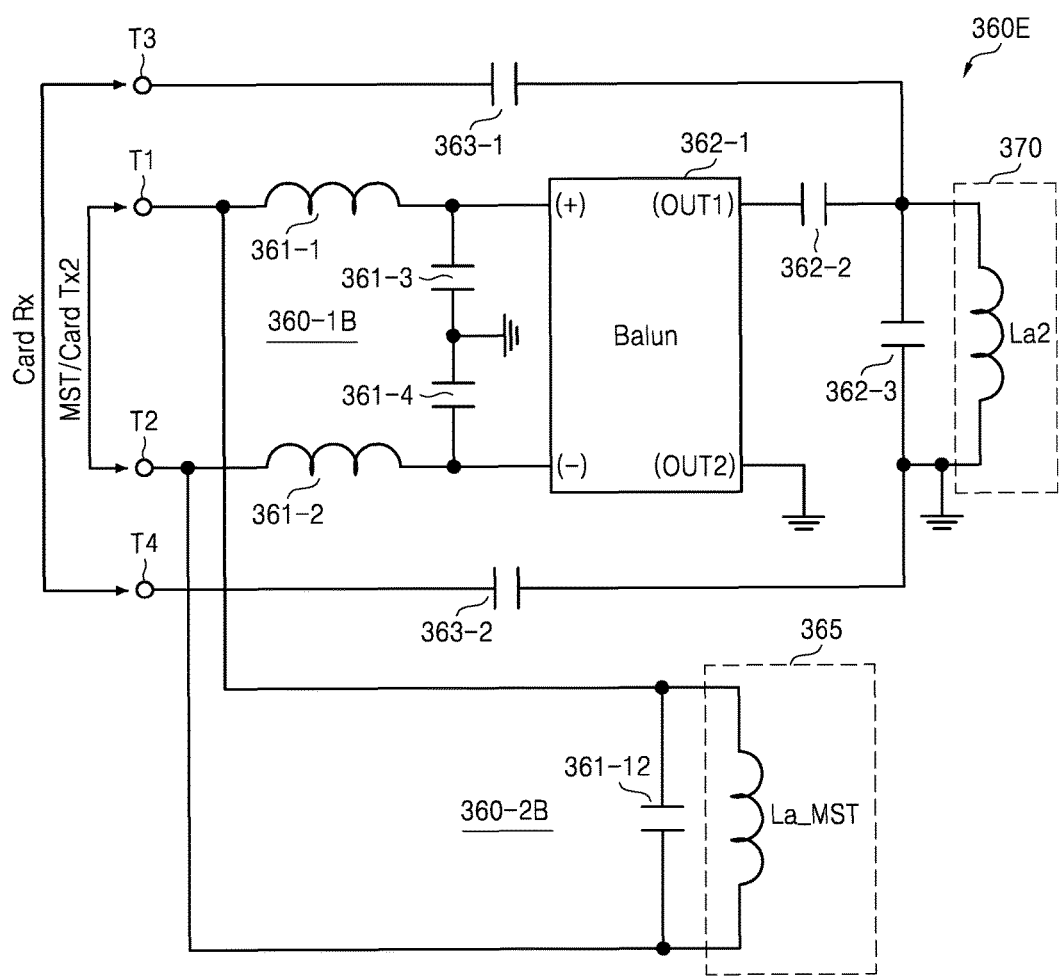
Figure 8:
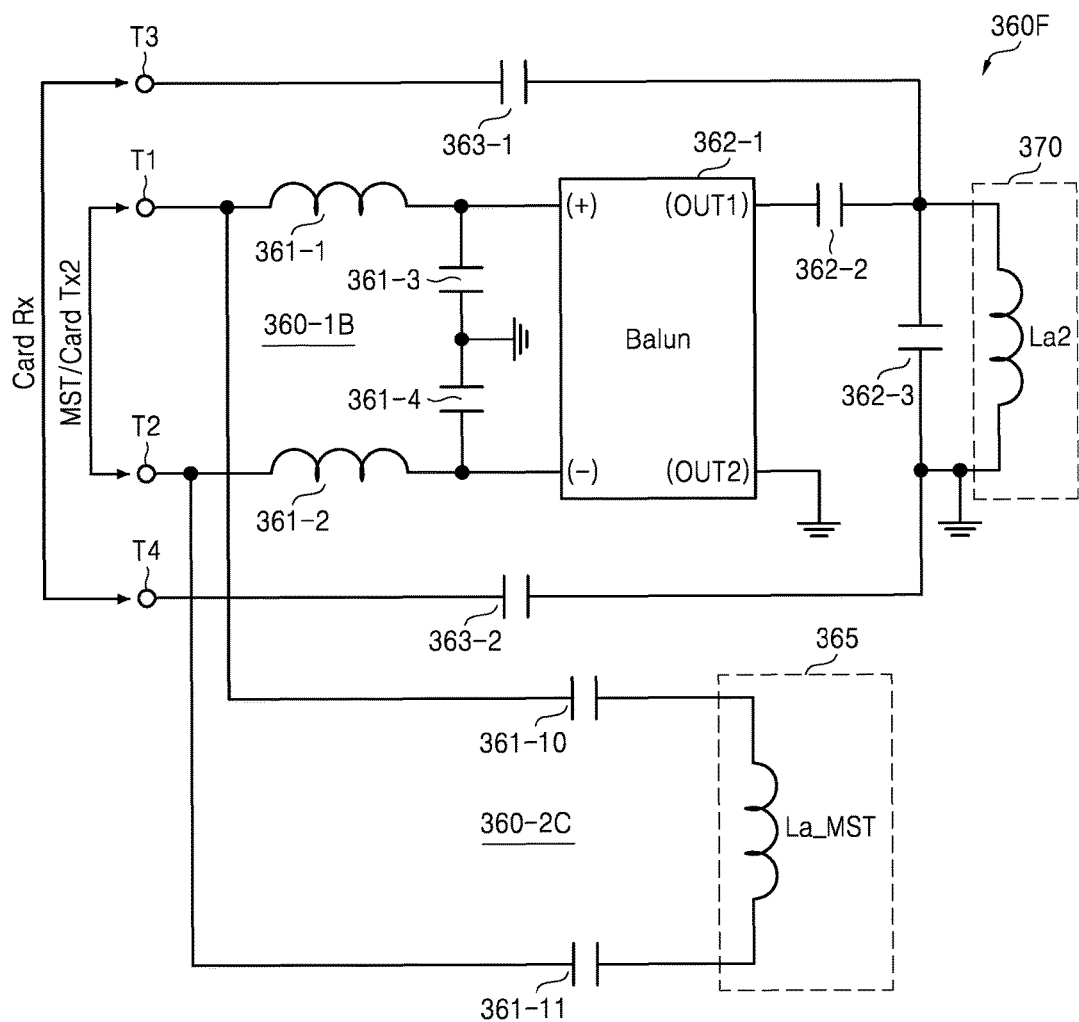

Referring to FIGS. 6 through 8, the first matching circuit 360-1B may include a conversion circuit 362-1. The conversion circuit 362-1 may be implemented as a balance-to-unbalance (Balun) circuit. The Balun circuit converts a balanced signal into an unbalanced signal. In single-ended signaling, an electric wire transmits a varying voltage representing a signal and another electric wire is connected to a reference voltage, e.g., a ground voltage.

Referring to FIGS. 2 and 6, the second matching network 360D includes the first matching circuit 360-1B for only the second NFC card mode and the second matching circuit 360-2A for the MST. As described above, the first matching circuit 360-1B uses a frequency bandwidth of 13.56 MHz and the second matching circuit 360-2B uses a frequency bandwidth of up to 20 KHz.

The first matching circuit 360-1B may include a low-pass filter, the conversion circuit 362-1, an impedance matching capacitor 362-2, and a resonant capacitor 362-3. The low pass filter for passing the frequency bandwidth of 13.56 MHz includes the inductors 361-1 and 361-2 and the capacitors 361-3 and 361-4.

Positive and negative input terminals of the conversion circuit 362-1 are connected to the inductors 361-1 and 361-2, respectively. A first output terminal OUT1 of the conversion circuit 362-1 is connected to the impedance matching capacitor 362-2. A second output terminal OUT2 of the conversion circuit 362-1 is connected to the ground.

The second NFC antenna 370 is connected in parallel with the resonant capacitor 362-3. A terminal of the second NFC antenna 370 is connected to the ground. The reference character La2 denotes the inductance of the second NFC antenna 370. The first matching circuit 360-1B may also include capacitors 363-1 and 363-2 for the card receiver 340. The terminals T1 and T2 are connected to the output terminals of the common transmitter 325 and the terminals T3 and T4 are connected to the input terminals of the card receiver 340.

The structure of the second matching circuit 360-2A illustrated in FIG. 6 is the same as that of the second matching network 360A-2A illustrated in FIG. 3. The second matching circuit 360-2A includes all of the serial capacitors 361-10 and 361-11 and the parallel capacitor 361-12.

FIG. 7 is a circuit diagram of a second matching network 360 according to yet another exemplary embodiment. The structure of the second matching network 360E illustrated in FIG. 7 is the same as that of the second matching network 360D illustrated in FIG. 6, except for the structure of the second matching circuit 360-2B. The second matching circuit 360-2B illustrated in FIG. 7 includes only the parallel capacitor 361-12 connected in parallel with the MST antenna 365.

FIG. 8 is a circuit diagram of a second matching network 360 according to still another exemplary embodiment. The structure of the second matching network 360F illustrated in FIG. 8 is the same as that of the second matching network 360D illustrated in FIG. 6, except for the structure of the second matching circuit 360-2C. The second matching circuit 360-2C illustrated in FIG. 8 includes only the serial capacitors 361-10 and 361-11 connected in series with the MST antenna 365.

Figure 9:
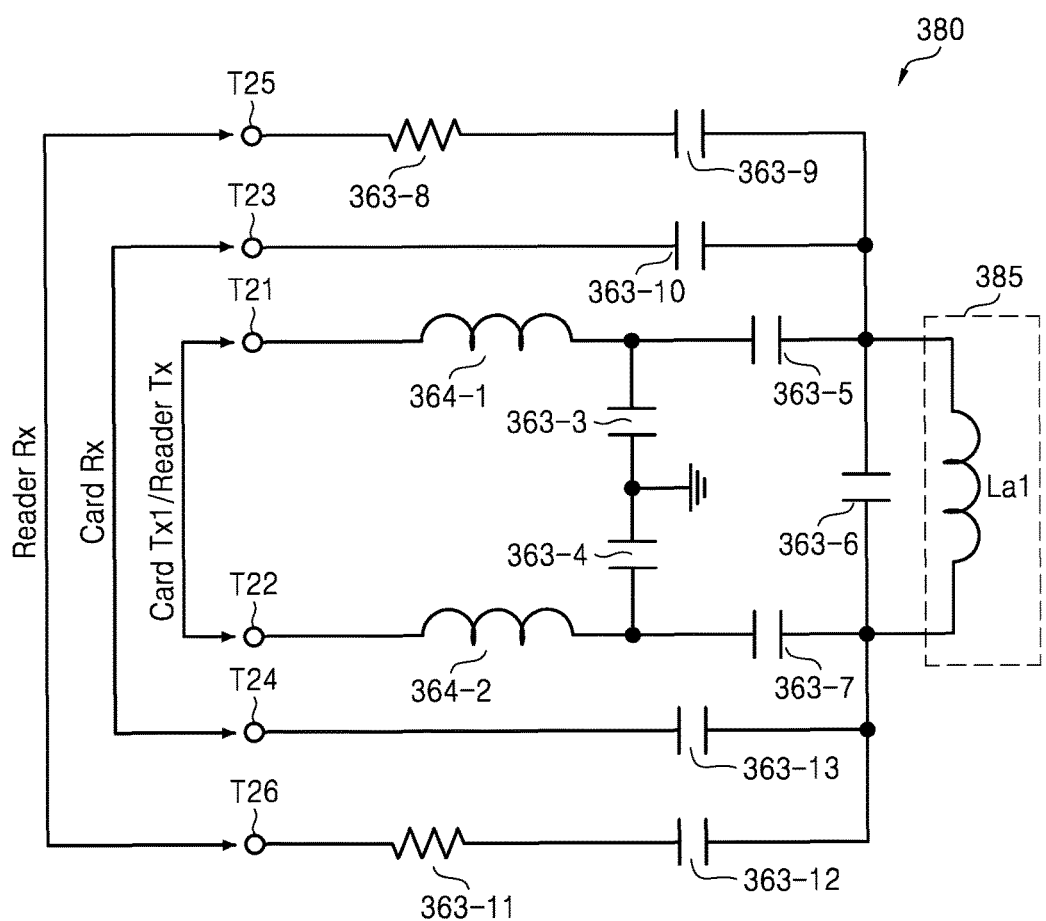
FIG. 9 is a circuit diagram of a first matching network according to one or more exemplary embodiments.

FIG. 9 is a circuit diagram of a first matching network 380. Referring to FIGS. 2 and 9, the first matching network 380 may include a low-pass filter, impedance matching capacitors 363-5 and 363-7, and a resonant capacitor 363-6.

The low-pass filter includes inductors 364-1 and 364-2 and capacitors 363-3 and 363-4. The first NFC antenna 385 is connected in parallel with the resonant capacitor 363-6. A reference character La1 denotes an inductance of the first NFC antenna 385.

The first matching network 380 may also include capacitors 363-10 and 363-13 for the card receiver 340. Terminals T23 and T24 may be connected to the input terminals of the card receiver 340. The first matching network 380 may also include resistors 363-8 and 363-11, and capacitors 363-9 and 363-12 for the reader transceiver 350. Terminals T25 and T26 may be connected to receiving terminals of a receiver of the reader transceiver 350. The card transmitter 345 may transmit third data signals to the terminals T21 and T22. The reader transceiver 350 may transmit fourth data signals to the terminals T21 and T22. The third data signals or the fourth data signals may be differential signals. The terminals T21 and T22 may be used as first transmitting pins.

FIG. 10 is a diagram of the layout of the antennas 365, 370, and 385 illustrated in FIG. 2. Referring to FIGS. 2 through 10, MST and NFC uses a loop antenna, and therefore, the MST antenna 365 and the first NFC antenna 385 may be disposed around the center of the read 210 of the mobile device 200. The first NFC antenna 385 may be disposed around the center of the back side 210 of the mobile because the first NFC antenna 385 is used for the NFC reader mode (the first NFC card mode), the peer-to-peer mode consumes relative large power and a user usually uses the back side 210 of the mobile device 200 to allow an NFC card (or a NFC tag) to be recognized.

Because the second NFC antenna 370 is used for only the second NFC card mode which consumes relatively small power, it may be disposed at the upper portion of the back side 210 of the mobile device 200. The second NFC antenna 370 may be implemented as a metal antenna. The second NFC antenna 370 may be disposed at the upper portion of the back side 210 of the mobile device 200 for a user's convenience and NFC operational characteristics as well. A metal frame 212 may be disposed at the back side 210 of the mobile device 200.

Although the MST antenna 365 is surrounded by the first NFC antenna 385 in the exemplary embodiment illustrated in FIG. 10, this is not limiting, and the MST antenna 365 may be surround the first NFC antenna 385 in other exemplary embodiments. As described above, a transmitter for the second NFC card mode and a transmitter for the MST may be integrated into the common transmitter 325, as shown in FIG. 2.

Because the construction (e.g., including the elements 325, 360, and 365) for the MST is similar to that (e.g., including the elements 325, 360, and 370) for the NFC and controls greater current than that for the NFC, the construction for the MST can consume greater power than that for the NFC. Even when the metal antenna 370 for only the second NFC card mode has a low inductance, the metal antenna 370 may have similar characteristics to the loop antenna 385. The metal antenna 370 may also be called a metal frame antenna, a metal case antenna, or a metal body antenna.

Figure 11:
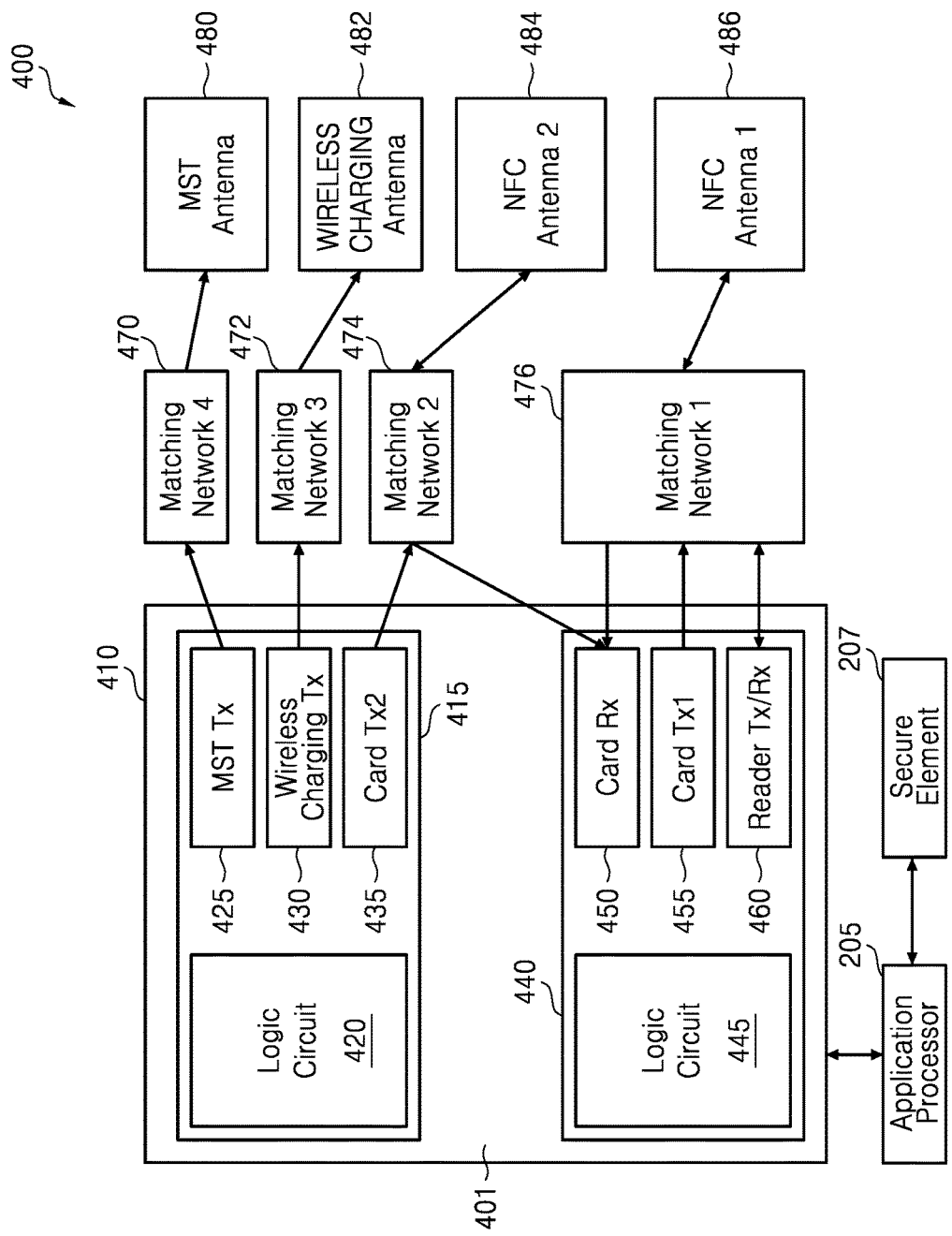
FIG. 11 is a schematic block diagram of an NFC system embedded in a mobile device according to one or more exemplary embodiments.

FIG. 11 is a schematic block diagram of an NFC system 400 according to one or more exemplary embodiments. Referring to FIGS. 1 and 11, the NFC system 400 embedded in the mobile device 200 may include a communication chip (or a single-chip integrated circuit) 410, a fourth matching network 470, a third matching network 472, a second matching network 474, a first matching network 476, an MST antenna 480, a wireless charging antenna 482 which transmits an NFC signal for wireless charging, a second NFC antenna 484, and a first NFC antenna 486. Although the application processor 205 and the secure element 207 are illustrated together with the NFC system 400, this is exemplary, and the NFC system 400 may be the mobile device 200.

The application processor 205 may control the operation of the communication chip 410 and the secure element 207. The communication chip 410 implemented as a single-chip integrated circuit may include a first circuit 415 and a second circuit 440.

The first circuit 415 may include a first logic circuit 420, an MST transmitter 425, a wireless charging transmitter 430, and a second card mode transmitter 435. The first logic circuit 420 may control the operation (e.g., enabling or disabling) of each of the transmitters 425, 430, and 435 in response to a control signal output from the application processor 205. For instance, at least one of the transmitters 425, 430, and 435 may be enabled according to the control of the first logic circuit 420.

The fourth matching network 470 is used for data signal transmission and impedance matching between the MST transmitter 425 and the MST antenna 480. The fourth matching network 470 may transmit a data signal from the MST transmitter 425 to the MST antenna 480. The MST transmitter 425 may transmit a data signal for MST to the fourth matching network 470 through transmitting pins.

The third matching network 472 is used for data signal transmission and impedance matching between the wireless charging transmitter 430 and the wireless charging antenna 482. The third matching network 472 may transmit a data signal from the wireless charging transmitter 430 to the wireless charging antenna 482. The wireless charging transmitter 430 may transmit a data signal for wireless charging to the third matching network 472 through transmitting pins.

The second matching network 474 is used for data signal transmission and impedance matching between the second card mode transmitter 435 and the second NFC antenna 484. The second matching network 474 may transmit a data signal from the second card mode transmitter 435 to the second NFC antenna 484. The second matching network 474 is also used for data signal transmission and impedance matching between a card mode receiver 450 and the second NFC antenna 484. The second matching network 474 may transmit a data signal from the second NFC antenna 484 to the card mode receiver 450. The second card mode transmitter 435 may transmit data signals to the second matching network 474 through transmitting pins.

The second circuit 440 may include a second logic circuit 445, the card mode receiver 450, a first card mode transmitter 455, and a reader mode transceiver 460. The second logic circuit 445 may control the operation (e.g., enabling or disabling) of each of the card mode receiver 450, the first card mode transmitter 455, and the reader mode transceiver 460 in response to a control signal output from the application processor 205.

The circuits 415 and 440 may be disposed or integrated on a single-chip semiconductor substrate 401. The elements 420, 425, 430, 435, 445, 450, 455, and 460 illustrated in FIG. 11 are separated from one another according to their functions, but this is just an example. In other exemplary embodiments, the logic circuits 420 and 445 may be implemented together as a single logic circuit and the elements 450, 455, and 460 for the NFC may be implemented together as a single NFC transceiver.

The first matching network 476 may be used for data signal transmission and impedance matching between the first NFC antenna 486 and each of the card mode receiver 450, the first card mode transmitter 455, and the reader mode transceiver 460. The first matching network 476 may transmit a data signal from the first card mode transmitter 455 to the first NFC antenna 486 and may control the transmission of a data signal between the reader mode transceiver 460 and the first NFC antenna 486.

As shown in FIG. 11, the single-chip integrated circuit 410 includes the single-chip semiconductor substrate 401; the second transmitter 435 disposed on the single-chip semiconductor substrate 401 to be used for the first NFC card mode; a first transmitter disposed on the single-chip semiconductor substrate 401 to be used in common for the first NFC card mode, the NFC reader mode, and the peer-to-peer mode; second transmitting pins connected to the single-chip semiconductor substrate 401 to transmit an output signal of the second transmitter 435 to the second NFC antenna 484; first transmitting pins connected to the single-chip semiconductor substrate 401 to transmit an output signal of the first transmitter to the first NFC antenna 486; a logic circuit disposed on the single-chip semiconductor substrate 401 to control the operations of the first transmitter and the second transmitter 435 in response to a control signal received from a device (e.g., the application processor 205) outside the single-chip integrated circuit 410. As described above, the first transmitter may include a transmitter in the reader mode transceiver 460 and the first card mode transmitter 455. The logic circuit may include the logic circuits 420 and 445.

The single-chip integrated circuit 410 may also include the third transmitter 425 disposed on the single-chip semiconductor substrate 401 to be used for the MST and third transmitting pins connected to the single-chip semiconductor substrate 401 to transmit an output signal of the third transmitter 425 to the MST antenna 480. At this time, the logic circuit may enable at least one among the first transmitter, the second transmitter 435, and the third transmitter 425 in response to a control signal output from the application processor 205.

The single-chip integrated circuit 410 may also include the fourth transmitter 430 disposed on the single-chip semiconductor substrate 401 to be used for wireless charging and fourth transmitting pins connected to the single-chip semiconductor substrate 401 to transmit an output signal of the fourth transmitter 430 to the wireless charging antenna 482. At this time, the logic circuit may enable at least one among the first transmitter, the second transmitter 435, the third transmitter 425, and the fourth transmitter 430 in response to a control signal output from the application processor 205. The logic circuit including the logic circuits 420 and 445 may control the operation of each of the transmitters 425, 430, 435, 455, and 460.

Figure 12:
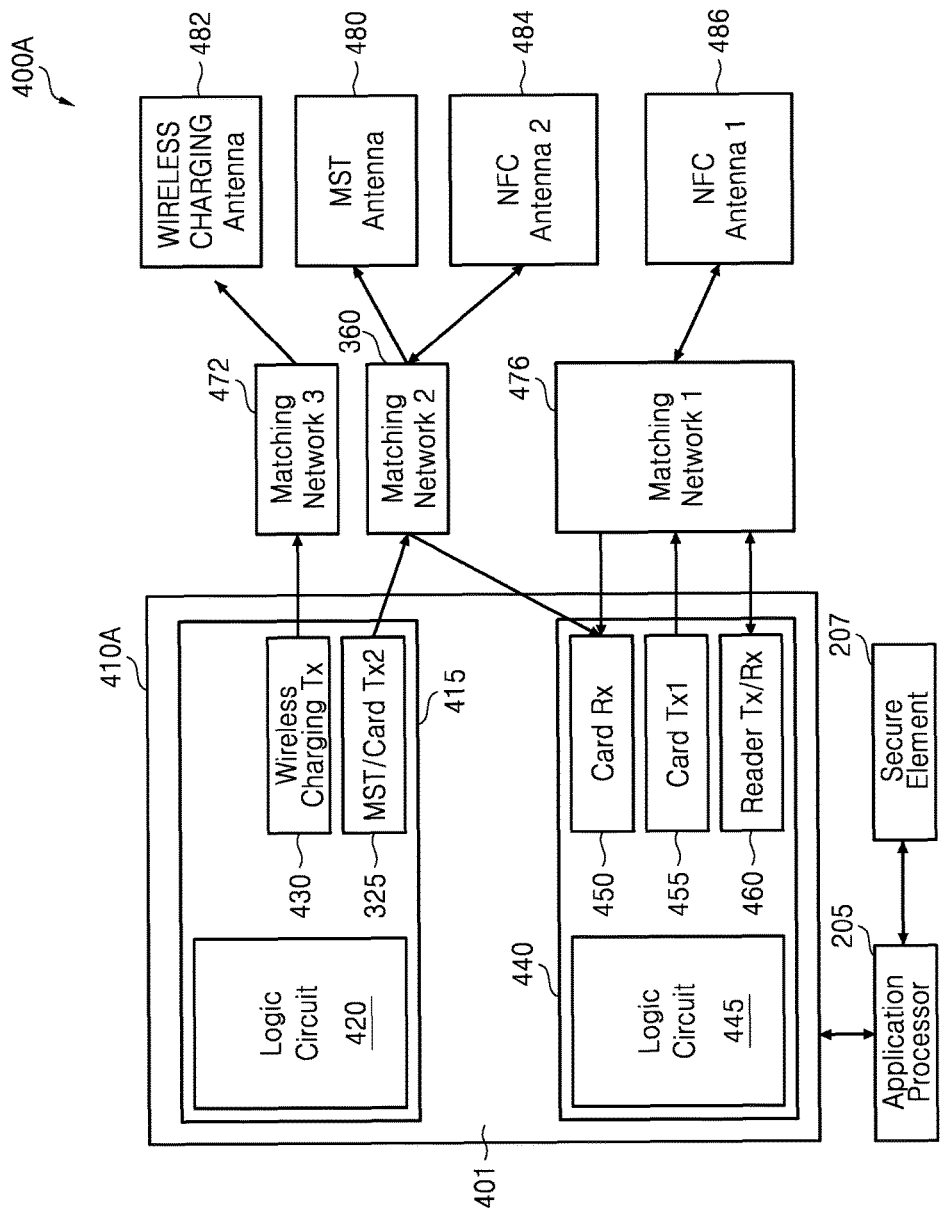
FIG. 12 is a schematic block diagram of an NFC system embedded according to one or more exemplary embodiments.

FIG. 12 is a schematic block diagram of an NFC system 400A according to one or more exemplary embodiments. Referring to FIGS. 11 and 12, the NFC system 400A may include a communication chip (or a single-chip integrated circuit) 410A, the third matching network 472, the second matching network 360, the first matching network 476, the MST antenna 480, the wireless charging antenna 482 which transmits an NFC signal for wireless charging, the second NFC antenna 484, and the first NFC antenna 486. The NFC system 400A may be the mobile device 200.

The MST transmitter 425 and the second card mode transmitter 435 illustrated in FIG. 11 may be replaced with the single common transmitter 325. Transmitting pins for transmitting an output signal of the second card mode transmitter 435 to the second NFC antenna 484 and transmitting pins for transmitting an output signal of the MST transmitter 425 to the MST antenna 480 may be implemented together using common transmitting pins (e.g., T1 and T2 illustrated in FIGS. 3 through 8). Accordingly, the common transmitter 325 illustrated in FIG. 12 may transmit either a first data signal for the MST or a second data signal for the second NFC card mode to the common transmitting pins T1 and T2.

Figure 13:
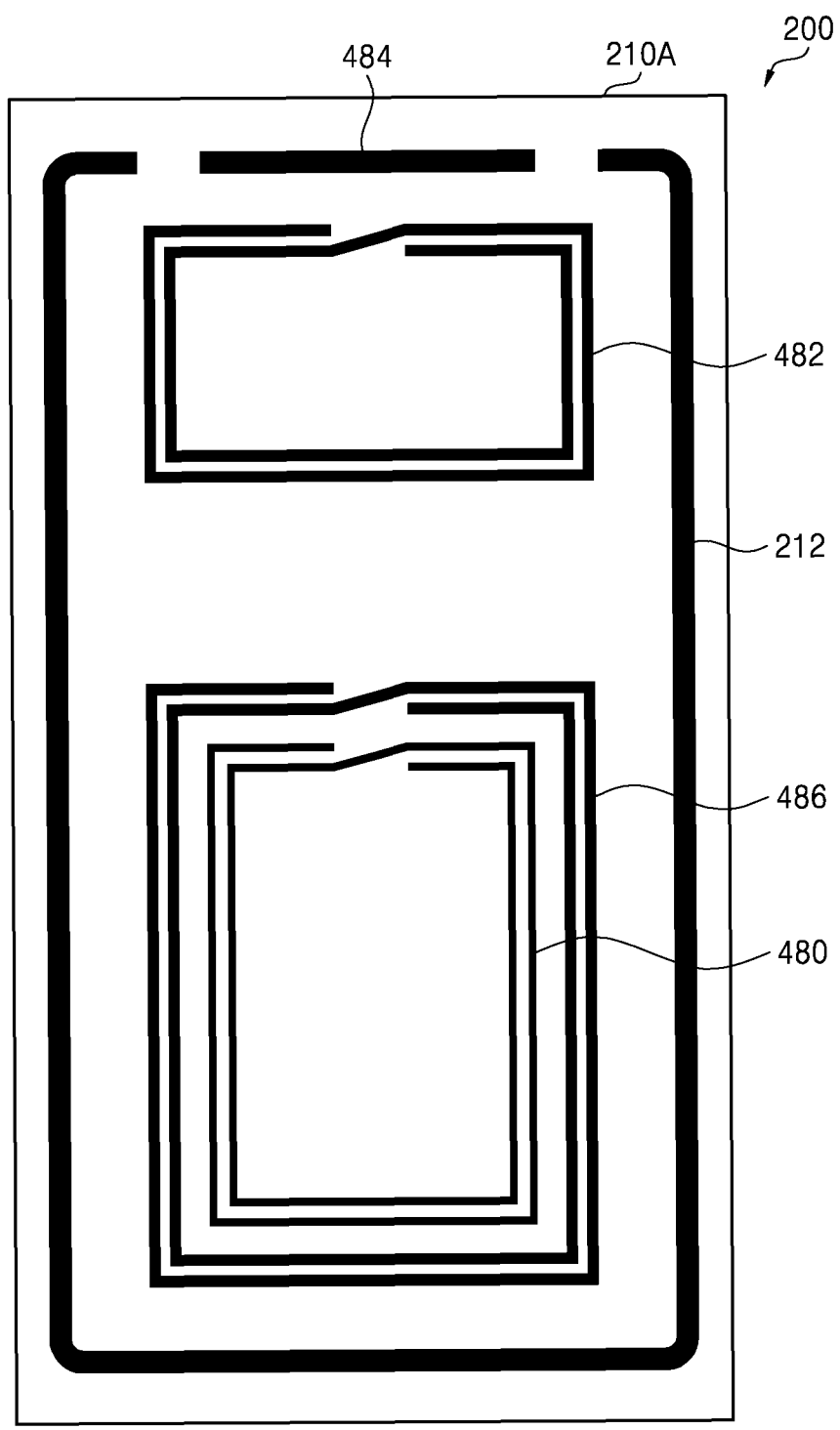
FIG. 13 is a diagram of the layout of antennas to support various kinds of radio communication according to one or more exemplary embodiments.

FIG. 13 is a diagram of the layout of the antennas 480, 482, 484, and 486 illustrated in FIG. 11 or 12 to support various kinds of radio communication. Referring to FIGS. 11 through 13, the antennas 480, 482, 484, and 486 may be disposed on the back side 210 of the mobile device 200.

The MST antenna 480 is a loop antenna and is disposed around the center of the back side 210. The wireless charging antenna 482 is a loop antenna and is disposed at the upper portion of the back side 210. The second NFC antenna 484 for only the second NFC card mode is disposed at the upper portion of the back side 210. The first NFC antenna 486 used in common for the first NFC card mode, the NFC reader mode, and the peer-to-peer mode is a loop antenna and is disposed around the center of the back side 210. Although the MST antenna 480 is surrounded by the first NFC antenna 486 in FIG. 13, this is an example, and the MST antenna 480 may surround the first NFC antenna 486 in other exemplary embodiments.

Figure 14:
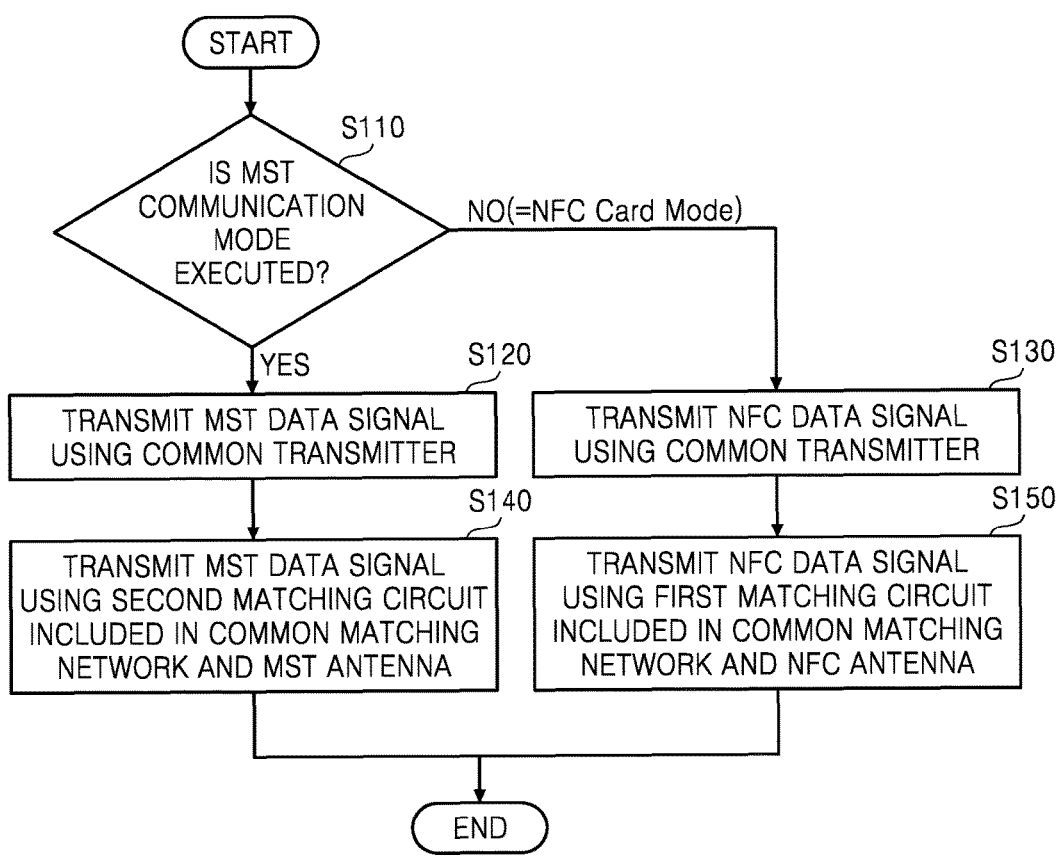
FIG. 14 is a flowchart of a method of communicating using either magnetic secure transmission (MST) or NFC according to one or more exemplary embodiments.

FIG. 14 is a flowchart of a method of communicating a data signal using either the MST or the NFC according to one or more exemplary embodiments. Referring to FIGS. 1 through 10 and FIG. 14, a user of the mobile device 200 may execute the first payment application 201.

The communication chip 310 prepares to execute the MST mode according to the control of the application processor 205 (i.e., in case of YES) in operation S110. The common transmitter 325 of the communication chip 310 transmits an MST data signal (or a first data signal) from the first logic circuit 320 to the second matching network 360 in operation S120. The MST data signal may include payment information of the user of the mobile device 200 which has been output from the secure element 207. The MST data signal from the common transmitter 325 is transmitted to an external device (e.g., the payment terminal 100) through the second matching circuit 360-2A, 360-2B, or 360-2C of the second matching network 360 and the MST antenna 365 in operation S140.

Alternatively, the user of the mobile device 200 may execute the second payment application 202. The communication chip 310 prepares to execute the second NFC mode according to the control of the application processor 205 (i.e., in case of NO) in operation S110. The common transmitter 325 of the communication chip 310 transmits an NFC data signal (or a second data signal) from the first logic circuit 320 to the second matching network 360 in operation S130. The NFC data signal may include payment information of the user of the mobile device 200 which has been output from the secure element 207. The NFC data signal from the common transmitter 325 is transmitted to an external device (e.g., the payment terminal 100) through the first matching circuit 360-1A or 360-1B of the second matching network 360 and the second NFC antenna 370 in operation S150.

FIG. 15 is a flowchart of a method of operating the NFC system 400 illustrated in FIG. 11 according to one or more exemplary embodiments. Referring to FIGS. 11 through 13 and FIG. 15, it is assumed that the mobile device 200 operates in an idle mode in operation 5210.

The application processor 205 may determine whether wireless charging has been connected in operation 5220. The logic circuit 420 may receive a wireless charging request signal output from a device requesting wireless charging through a wireless charging pad (i.e., in case of YES) in operation 5220 and may transmit the wireless charging request signal to the application processor 205. The application processor 205 may transmit a control signal to the logic circuit 420 in response to the wireless charging request signal. The logic circuit 420 may enable the wireless charging transmitter 430 in response to the control signal in operation S225. The wireless charging transmitter 430 may transmit a signal for wireless charging to the device requesting the wireless charging through the third matching network 472 and the wireless charging antenna 482.

However, when any wireless charging request signal has not been received from the wireless charging pad (i.e., in case of NO) in operation 5220, the application processor 205 may determine whether the application 201 or 203 for payment is executed in operation 5230. When the wireless charging has not been connected (i.e., in case of NO) in operation 5220 and the application 201 or 203 for payment is not executed (i.e., in case of NO) in operation 5230, the mobile device 200 maintains the idle mode in operation 5210.

When the application 201 or 203 for payment is executed (i.e., in case of YES) in operation 5230, the application processor 205 may determine whether an NFC reader signal has been detected in operation S235. The NFC reader signal may be transmitted from at least one of the antennas 484 and 486 to the single-chip integrated circuit 410 or 410A. The NFC reader signal may have been output from an NFC reader, e.g., the payment terminal 100.

The card mode receiver 450 may receive the NFC reader signal from the matching network 474 or 476 and may transmit the NFC reader signal to the logic circuit 445. The logic circuit 445 may transmit an indicator signal indicating whether the NFC reader signal has been received or not to the application processor 205. The application processor 205 may determine about the reception of the NFC reader signal in response to the indicator signal in operation S235.

When the NFC reader signal has not been detected (i.e., in case of NO) in operation S235, the application processor 205 may transmit a control signal for enabling the MST transmitter 425 or the common transmitter 325 to the logic circuit 420. The MST transmitter 425 illustrated in FIG. 11 may transmit a first data signal for the MST to the payment terminal 100 through the fourth matching network 470 and the MST antenna 480 in operation 5240. The common transmitter 325 illustrated in FIG. 12 may transmit the first data signal for the MST to the payment terminal 100 through the second matching network 360 and the MST antenna 480 in operation 5240. At this time, the application which is being executed for the payment may be the first application 201.

When the NFC reader signal has been detected (i.e., in case of YES) in operation S235, the application processor 205 may determine whether the NFC reader signal has been received through the first NFC antenna 486 in operation S245. When the NFC reader signal has been received through the first NFC antenna 486 (i.e., in case of YES) in operation S245, the application processor 205 transmits a control signal for enabling the first card mode transmitter 455 to the logic circuit 445. The logic circuit 445 may enable the first card mode transmitter 455 in response to the control signal in operation S250. The first card mode transmitter 455 may transmit a data signal for the payment to the payment terminal 100 through the first matching network 476 and the first NFC antenna 486 in operation S250. At this time, the application which is being executed for the payment may be the second application 203.

When the NFC reader signal has not been received through the first NFC antenna 486 (i.e., in case of NO) in operation S245, the application processor 205 may transmit a control signal for enabling the second card mode transmitter 435 or the common transmitter 325 to the logic circuit 420.

Referring to FIG. 11, the logic circuit 420 may enable the second card mode transmitter 435 in response to the control signal in operation S255. The second card mode transmitter 435 may transmit a data signal for the payment to the payment terminal 100 through the second matching network 474 and the second NFC antenna 484 in operation S250. At this time, the application which is being executed for the payment may be the second application 203.

Referring to FIG. 12, the logic circuit 420 may enable the common transmitter 325 in response to the control signal in operation S255. The common transmitter 325 may transmit a data signal for the payment to the payment terminal 100 through the second matching network 360 and the second NFC antenna 484 in operation S250. At this time, the application which is being executed for the payment may be the second application 203.

As described above, according to one or more exemplary embodiments, a single-chip integrated circuit including a single-chip semiconductor substrate includes various transceivers supporting multiple communication modes, which are disposed or integrated on the single-chip semiconductor substrate, thereby supporting various kinds of radio communication protocols. In addition, an NFC system including the single-chip integrated circuit includes various kinds of antennas connected to multiple diverse transmitters, and these antennas can be arranged to increase convenience, so that the NFC system can improve NFC operational characteristics using the single-chip integrated circuit.

While the inventive concept has been particularly shown and described with reference to exemplary embodiments thereof, it will be understood by those of ordinary skill in the art that various changes in forms and details may be made therein without departing from the spirit and scope of the inventive concept as defined by the following claims.

What is claimed is:

1. An integrated circuit for near field communication (NFC), the integrated circuit comprising:
    a semiconductor substrate;
    a first transmitter disposed on the semiconductor substrate and configured to operate in a first NFC card mode, an NFC reader mode, and a peer-to-peer mode;
    a second transmitter disposed on the semiconductor substrate and configured to operate in a second NFC card mode;
    a third transmitter disposed on the semiconductor substrate and configured to operate in a magnetic secure transmission (MST) mode;
    first transmitting pins connected to the semiconductor substrate and configured to transmit an output signal of the first transmitter to a first NFC antenna;
    second transmitting pins connected to the semiconductor substrate and configured to transmit an output signal of the second transmitter to a second NFC antenna;
    third transmitting pins connected to the semiconductor substrate and configured to transmit an output signal of the third transmitter to an MST antenna; and
    a logic circuit disposed on the semiconductor substrate and configured to receive a control signal, control an operation of the first transmitter and an operation of the second transmitter based on the control signal, and enable one among the first transmitter, the second transmitter and the third transmitter based on the control signal.

2. An integrated circuit for near field communication (NFC), the integrated circuit comprising:
    a semiconductor substrate;
    a first transmitter disposed on the semiconductor substrate and configured to operate in a first NFC card mode, an NFC reader mode, and a peer-to-peer mode;
    a second transmitter disposed on the semiconductor substrate and configured to operate in a second NFC card mode;
    first transmitting pins connected to the semiconductor substrate and configured to transmit an output signal of the first transmitter to a first NFC antenna;
    second transmitting pins connected to the semiconductor substrate and configured to transmit an output signal of the second transmitter to a second NFC antenna; and
    a logic circuit disposed on the semiconductor substrate and configured to receive a control signal, control an operation of the first transmitter and an operation of the second transmitter based on the control signal, and enable one among the first transmitter and the second transmitter based on the control signal,
    wherein the second transmitter is further configured to operate in a magnetic secure transmission (MST) mode and transmit one among a first data signal for the MST mode and a second data signal for the second NFC card mode to the second transmitting pins.

3. The integrated circuit of claim 1, further comprising:
    a fourth transmitter disposed on the semiconductor substrate configured to operate in a wireless charging mode; and
    fourth transmitting pins connected to the semiconductor substrate and configured to transmit an output signal of the fourth transmitter to a wireless charging antenna,
    wherein the logic circuit is further configured to enable one among the first transmitter, the second transmitter, the third transmitter and the fourth transmitter based on the control signal.

4. The integrated circuit of claim 1, wherein the second transmitter is further configured to operate in the second NFC card mode and the MST mode, and to transmit one among a first data signal for the MST mode and a second data signal for the second NFC card mode to the second transmitting pins.

5. A near field communication (NFC) system comprising:
    an integrated circuit;
    a processor configured to control an operation of the integrated circuit;
    a first NFC antenna; and
    a second NFC antenna,
    wherein the integrated circuit comprises:
        a semiconductor substrate;
        a first transmitter disposed on the semiconductor substrate and configured to operate in a first NFC card mode, an NFC reader mode, and a peer-to-peer mode;
        a second transmitter disposed on the semiconductor substrate and configured to operate in a second NFC card mode;
        first transmitting pins connected to the semiconductor substrate and configured to transmit an output signal of the first transmitter to the first NFC antenna;
        second transmitting pins connected to the semiconductor substrate and configured to transmit an output signal of the second transmitter to the second NFC antenna; and
        a logic circuit disposed on the semiconductor substrate and configured to control an operation of the first transmitter and an operation of the second transmitter according to control of the processor, determine whether a radio signal has been received through the first NFC antenna, and transmit a determination signal to the processor,
    wherein the processor is further configured to transmit a control signal to the logic circuit based on the determination signal, and
    wherein the logic circuit is further configured to enable the first transmitter based on the control signal indicating that the radio signal has been received and enable the second transmitter based on the control signal indicating that the radio signal has not been received.

6. The NFC system of claim 5, wherein the integrated circuit further comprises:
    a third transmitter disposed on the semiconductor substrate and configured to operate in a magnetic secure transmission (MST) mode; and
    third transmitting pins connected to the semiconductor substrate and configured to transmit an output signal of the third transmitter to an MST antenna,
    wherein the logic circuit is further configured to enable one among the first transmitter, the second transmitter and the third transmitter according to the control of the processor.

7. The NFC system of claim 5, wherein the second transmitter is further configured to operate in the MST mode.

8. The NFC system of claim 7, further comprising:
a first matching network connected between the first transmitting pins and the first NFC antenna;
an MST antenna; and
a second matching network connected among the second transmitting pins, the MST antenna, and the second NFC antenna,
wherein the second transmitter is further configured to transmit one among a first data signal for the MST mode and a second data signal for the second NFC card mode to the second transmitting pins, and
the second matching network is further configured to transmit the first data signal having a first frequency bandwidth to the MST antenna and transmit the second data signal having a second frequency bandwidth different from the first frequency bandwidth to the second NFC antenna.

9. The NFC system of claim 8, wherein the first NFC antenna and the MST antenna have a first shape, and the second NFC antenna has a second shape different from the first shape.

10. The NFC system of claim 8, wherein the second matching network comprises:
a first resonance and impedance matching circuit connected between the second transmitting pins and the second NFC antenna, and configured to transmit only the second data signal; and
a second resonance and impedance matching circuit connected between the second transmitting pins and the MST antenna, and configured to transmit only the first data signal.

11. The NFC system of claim 10, wherein the second resonance and impedance matching circuit comprises:
a first capacitor connected in parallel with the MST antenna;
a second capacitor connected between one among the second transmitting pins and a first terminal of the first capacitor; and
a third capacitor connected between another one among the second transmitting pins and a second terminal of the first capacitor.

12. The NFC system of claim 10, wherein the second resonance and impedance matching circuit comprises a capacitor connected in parallel with the MST antenna.

13. The NFC system of claim 10, wherein the second resonance and impedance matching circuit comprises:
a first capacitor connected between one among the second transmitting pins and a first terminal of the MST antenna; and
a second capacitor connected between another one among the second transmitting pins and a second terminal of the MST antenna.

14. The NFC system of claim 10, wherein a terminal of the second NFC antenna is connected to ground, and the second resonance and impedance matching circuit comprises a balun for single-ended signaling.

15. The NFC system of claim 10, wherein a terminal of the second NFC antenna is connected to ground, and
the first resonance and impedance matching circuit comprises:
a low-pass filter connected to the second transmitting pins;
a balun connected to the low-pass filter;
a first capacitor connected in parallel with the second NFC antenna; and
a second capacitor connected between a first output terminal of the balun and another terminal of the second NFC antenna.

16. The NFC system of claim 5, wherein the NFC system is a mobile device.

17. The NFC system of claim 6, further comprising:
a wireless charging antenna;
a fourth transmitter disposed on the semiconductor substrate configured to operate in a wireless charging mode;
fourth transmitting pins connected to the semiconductor substrate and configured to transmit an output signal of the fourth transmitter to the wireless charging antenna;
a first matching network connected between the third transmitting pins and the MST antenna; and
a second matching network connected between the fourth transmitting pins and the wireless charging antenna,
wherein the logic circuit is further configured to enable one among the first transmitter, the second transmitter, the third transmitter and the fourth transmitter according to the control of the processor.

18. The NFC system of claim 5, wherein the second transmitter is further configured to operate in the second NFC card mode and the MST mode, transmit one among a first data signal for the MST mode and a second data signal for the first NFC card mode to the second transmitting pins, and transmit the first data signal having a first frequency bandwidth to an MST antenna and transmit the second data signal having a second frequency bandwidth different from the first frequency bandwidth to the second NFC antenna.

* * * * *